(12) United States Patent
Kim (10) Patent No.: US 9,708,705 B2
(45) Date of Patent: Jul. 18, 2017

(54) THIN FILM DEPOSITION APPARATUS WITH MASK ROLL INCLUDING MULTIPLE MASK PATTERNS AND METHOD OF MAKING ORGANIC LIGHT EMITTING DEVICE USING THE APPARATUS

(71) Applicant: Samsung Display Co., Ltd., Yongin, Gyeonggi-Do (KR)

(72) Inventor: Ki-Hyun Kim, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 287 days.

(21) Appl. No.: 14/021,717

(22) Filed: Sep. 9, 2013

(65) Prior Publication Data

US 2014/0315343 A1 Oct. 23, 2014

(30) Foreign Application Priority Data

Apr. 17, 2013 (KR) .................. 10-2013-0042357

(51) Int. Cl.
| | |
|---|---|
| C23C 16/04 | (2006.01) |
| C23C 14/04 | (2006.01) |
| H01L 51/56 | (2006.01) |
| H01L 51/00 | (2006.01) |
| C23C 14/24 | (2006.01) |
| C23C 14/12 | (2006.01) |
| C23C 14/50 | (2006.01) |
| C23C 14/56 | (2006.01) |

(52) U.S. Cl.
CPC ............ *C23C 14/042* (2013.01); *C23C 14/12* (2013.01); *C23C 14/24* (2013.01); *C23C 14/50* (2013.01); *C23C 16/042* (2013.01); *H01L 51/0011* (2013.01); *C23C 14/562* (2013.01)

(58) Field of Classification Search
None
See application file for complete search history.

(56) References Cited

U.S. PATENT DOCUMENTS

| | | | |
|---|---|---|---|
| 2008/0044556 A1* | 2/2008 | Baude | C23C 14/042 118/720 |
| 2013/0025481 A1* | 1/2013 | Moncavage | B05C 17/08 101/126 |
| 2013/0186335 A1* | 7/2013 | Kawato | C23C 14/042 118/720 |
| 2013/0273746 A1* | 10/2013 | Kawato | C23C 14/562 438/758 |

FOREIGN PATENT DOCUMENTS

| | | | |
|---|---|---|---|
| JP | 2013124373 | * | 6/2013 |
| KR | 10-2007-0059682 A | | 6/2007 |
| KR | 10-2008-0058602 A | | 6/2008 |
| KR | 10-2010-0072463 A | | 7/2010 |
| KR | 10-2012-0071341 A | | 7/2012 |
| WO | WO2012093627 A | * | 7/2012 |

* cited by examiner

*Primary Examiner* — Binu Thomas
(74) *Attorney, Agent, or Firm* — Knobbe Martens Olson & Bear LLP (57) ABSTRACT

Disclosed is a chemical vapor deposition system for forming an organic thin film over a substrate. The system introduces a mask roll including two or more mask patterns for depositing an organic material on the substrate. The mask roll is released from one side and takes up on the other side to selectively provide one of the two or more patterns.

6 Claims, 6 Drawing Sheets

THIN FILM DEPOSITION APPARATUS WITH MASK ROLL INCLUDING MULTIPLE MASK PATTERNS AND METHOD OF MAKING ORGANIC LIGHT EMITTING DEVICE USING THE APPARATUS

RELATED APPLICATIONS

This application claims priority to and the benefit of Korean Patent Application No. 10-2013-0042357 filed in the Korean Intellectual Property Office on Apr. 17, 2013, the entire contents of which are incorporated herein by reference.

BACKGROUND

1. Field

The described technology relates generally to an apparatus for depositing an organic thin film. In detail, the described technology relates generally to an apparatus for depositing an organic thin film on a substrate used to manufacture an organic electric field light emitting element.

2. Discussion of the Related Technology

Among display devices, OLED displays have a wide viewing angle, excellent contrast, and high response speed. Therefore, much attention is being paid to the OLED displays as next generation display devices.

The organic light emitting diode (OLED) display is manufactured by depositing and patterning a transparent conducting material on a substrate through a photolithography process to form a positive electrode (an anode) of a predetermined pattern, forming organic thin films representing R, G, and B colors on the positive electrode by using a deposition mask and an evaporation deposition technique, and forming a negative electrode (a cathode) of a predetermined pattern on the organic thin film.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a thin film deposition apparatus including a deposition mask of a roll-to-roll type using a flexible material of a thin film.

A thin film deposition apparatus according to an exemplary embodiment includes: a process chamber; a substrate supporting member disposed in the process chamber and supporting a substrate; a deposition source disposed to face the substrate supporting member and supplying an organic material to the substrate; and a deposition mask assembly including first and second rollers disposed in a direction parallel to the substrate to be separated from each other, and a thin film mask of a flexible material rolled to the first and second rollers and disposed close to the substrate.

The thin film mask may be provided as a flexible thin film type of a polymer, a metal, or a glass material.

The deposition mask assembly may further include a moving unit moving the first and second rollers such that the thin film mask is relatively moved with respect to the deposition surface of the substrate.

The moving unit may include a roller supporting member having a box shape of which one surface is opened and is supplied with the first and second rollers and receiving the deposition source therein, and a driver moving the roller supporting member.

The moving unit may include a roller supporting member positioned at an opposite side of the deposition source with respect to the thin film mask and coupled with the first and second rollers, and a driver moving the roller supporting member.

The driver may include: a rotation driver rotating the roller supporting member about a rotation axis perpendicular to the deposition surface of the substrate; a first linear driver linearly moving the roller supporting member in a direction of the rotation axis; a second linear driver linearly moving the roller supporting member in a first direction parallel to the deposition surface of the substrate; and a third linear driver linearly moving the roller supporting member in a second direction perpendicular to the first direction and parallel to the deposition surface of the substrate.

The thin film mask may include a plurality of deposition patterns having different shapes from each other along a length direction of the thin film mask.

The substrate supporting member may be loaded with the substrate in which the deposition layer is formed by one deposition pattern among the deposition patterns, and the first and second rollers may be rotated such that one deposition pattern of the thin film mask faces the substrate.

The substrate supporting member may be loaded with a large area substrate in which a deposition layer is formed with at least two deposition patterns among the deposition patterns, and the first and second rollers may be rotated along with the relative movement of the substrate supporting member, the first and second rollers, and the deposition source such that at least two deposition patterns of the thin film mask sequentially face different regions on the large area substrate.

The substrate supporting member can be moved in a direction parallel to the thin film mask with respect to the first and second rollers.

The first and second rollers and the deposition source can be moved in a direction parallel to the large area substrate with respect to the substrate supporting member.

One aspect of the invention provides a thin film deposition apparatus, which may comprise: a process chamber; a substrate support comprising a substantially flat surface configured to support a substrate in the process chamber; a deposition source configured to supply an organic material for deposition onto the substrate; a deposition mask assembly comprising first and second rollers disposed apart from each other in the process chamber; a thin film mask roll having a first end wound about the first roller and a second end wound about the second roller, wherein a deposition mask is defined on a first plane with a portion of the thin film mask roll extending between the first and second rollers; and a substrate transporting mechanism configured to transfer the substrate support on a second plane substantially parallel to the first plane within the process chamber.

In the foregoing apparatus, the thin film mask roll may comprise one selected from the group consisting of a polymer, a metal, or a glass material. The deposition mask assembly may further comprise a moving unit configured to move the first and second rollers with respect to the substrate support. The moving unit may comprise: a roller support member comprising a box which comprises an opened top, the first and second rollers being located adjacent the opened top, wherein the deposition source is located in the box; and a driver configured to move the roller support member. The moving unit may comprise: a roller support member positioned at an opposite side of the deposition source with respect to the deposition mask and coupled with the first and second rollers; and a driver configured to move the roller support member. The driver may comprise: a rotation driver configured to rotate the roller support member about a rotation axis perpendicular to the first plane; a first linear driver configured to linearly move the roller support member in a direction of the rotation axis; a second linear driver configured to linearly move the roller support member in a first direction parallel to the first plane; and a third linear driver linearly moving the roller support member in a second direction perpendicular to the first direction and parallel to the first plane.

Still in the foregoing apparatus, the thin film mask roll may comprise one or more additional deposition masks, the deposition masks comprising mask patterns substantially different from each other and being arranged in a length direction of the thin film mask roll. The substrate support may be configured to load a substrate subject to deposition using one deposition pattern selected among the deposition patterns; and the first and second rollers may be configured to rotate such that the selected deposition pattern of the thin film mask is placed between the first and second rollers. The substrate support member may be configured to load a substrate subject to deposition using at least two deposition patterns selected among the deposition patterns; and wherein the first and second rollers may be configured to rotate along with the relative movement of the substrate support, the first and second rollers, and the deposition source such that the selected deposition patterns of the thin film mask are sequentially placed between the first and second rollers to deposit different regions on the substrate. The substrate support may be configured to move in a direction parallel to the deposition mask with respect to the first and second rollers. The first and second rollers and the deposition source may be configured to move in a direction parallel to the substrate with respect to the substrate support.

Another aspect of the invention provides a method of making an organic light emitting device, which may comprise: providing the foregoing apparatus; placing a substrate on the substantially flat support; taking up the thin film mask roll with the second roller to provide a deposition mask between the first and second rollers; and transferring the substrate on the second plane to a predetermined location in the processing chamber for deposition.

The foregoing method may further comprise supplying an organic material toward the transferred substrate while the deposition mask is placed between the transferred substrate and the deposition source, thereby depositing the organic material onto the transferred substrate. The foregoing method may further comprise: supplying an organic material toward the transferred substrate while the deposition mask is placed between the transferred substrate and the deposition source, thereby depositing the organic material onto a first portion of the transferred substrate; subsequently to the deposition of the first portion, moving the transferred substrate relative to the deposition mask; and subsequently to the relative movement of the transferred substrate, supplying the organic material toward the transferred substrate while the deposition mask is placed between the transferred substrate and the deposition source, thereby depositing the organic material onto a second portion of the transferred substrate. In the foregoing method, taking up the thin film mask roll with the second roller may cause the deposition mask to move in a first direction, and the relative movement of the transferred substrate may cause the transferred substrate to move relative to the deposition mask in the first direction. Taking up the thin film mask roll with the second roller causes the deposition mask to move in a first direction, wherein the relative movement of the transferred substrate causes the transferred substrate to move relative to the deposition mask in the second direction substantially different from the first direction.

Still in the foregoing method, taking up the thin film mask roll with the second roller may cause the deposition mask to move in a first direction, and the substrate may be transferred in a second direction substantially different from the first direction. The foregoing method may further comprise rotating the transferred substrate relative to the deposition mask. In the foregoing method, the substrate may be transferred while rolling of the first and second rollers is stopped. The thin film mask roll may comprise an additional deposition mask, and the method may further comprise: supplying an organic material toward the transferred substrate through holes of the deposition mask, thereby depositing the organic material onto the transferred substrate; subsequently to the deposition of the organic material, taking up the thin film mask roll with one of the first and second rollers to provide the additional deposition mask between the first and second rollers; and subsequently to the provision of the additional deposition mask, supplying another organic material toward the transferred substrate through holes of the additional deposition mask, thereby depositing the other organic material onto the transferred substrate. The method may further comprise rolling one of the first and second rollers to tension the deposition mask placed between the first and second rollers.

According to an exemplary embodiment, the deposition mask of the roll-to-roll type using the thin film flexible material may be provided.

Also, according to an exemplary embodiment, the deposition mask including the precise and fine pattern may be provided.

Also, according to an exemplary embodiment, the sagging due to the large size of the mask may be minimized.

Also, according to an exemplary embodiment, a high resolution pixel may be realized.

BRIEF DESCRIPTION OF THE DRAWINGS

The drawings described below are for the purpose of illustration only and not intended to limit the scope of the present invention.

DETAILED DESCRIPTION

Embodiments of the present invention will be described in detail. However, it should be understood that the exemplary embodiments are not intended to limit the present invention, and various changes, modifications, and equivalents may fall within the spirits and scope of the present invention.

In the explanations of each drawing, like numbers are used for like constituent elements. In the accompanying drawings, the dimensions of the structure may be exaggerated for clarity of embodiments of the present invention. The terms of first, second, or the like may be used to describe the various constituent elements, but the constituent elements should not be limited by the above terms. The terms are only used to distinguish one constituent element from another constituent element. For example, a first constituent element could be termed a second constituent element, and similarly, a second constituent element could be termed a first constituent element, without departing from the scope of the present invention. Unless explicitly described to the contrary, the representation of the singular includes a multiple representation.

In this application, it should be understood that the terms such as "comprises" or "having" are to specify the presence of features, numbers, steps, operations, constituent elements, parts or any combination of them described in the specification, but it does not preclude the possibility of the presence or addition of one or more other features, numbers, steps, operations, constituent elements, parts, or any combination of them. When a portion of a layer, film, region, prate, or the like is referred to as being "on" another portion, it can be directly on the other portion, or intervening portions may be present. In contrast, when a portion of a layer, film, region, plate, or the like is referred to as being "below" another portion, it can be directly below the other portion or intervening portions may be present.

Generally, an organic light emitting diode (OLED) display is manufactured by forming the organic thin film and the electrodes having the pattern of a desired shape and size by using the deposition mask. In embodiments, the deposition mask may have a very fine slot pattern depending on a large size of the organic light emitting diode (OLED) display or miniaturization of the pixel. Also, when the organic light emitting diode (OLED) display has a large size, the large deposition mask is used. If the pixel due to the light emitting layer made of the organic thin film is small, the deposition mask may be formed to be ultra-thin.

Hereinafter, an exemplary embodiment will be described in detail with reference to FIG. 1 to FIG. 6.

Figure 1:
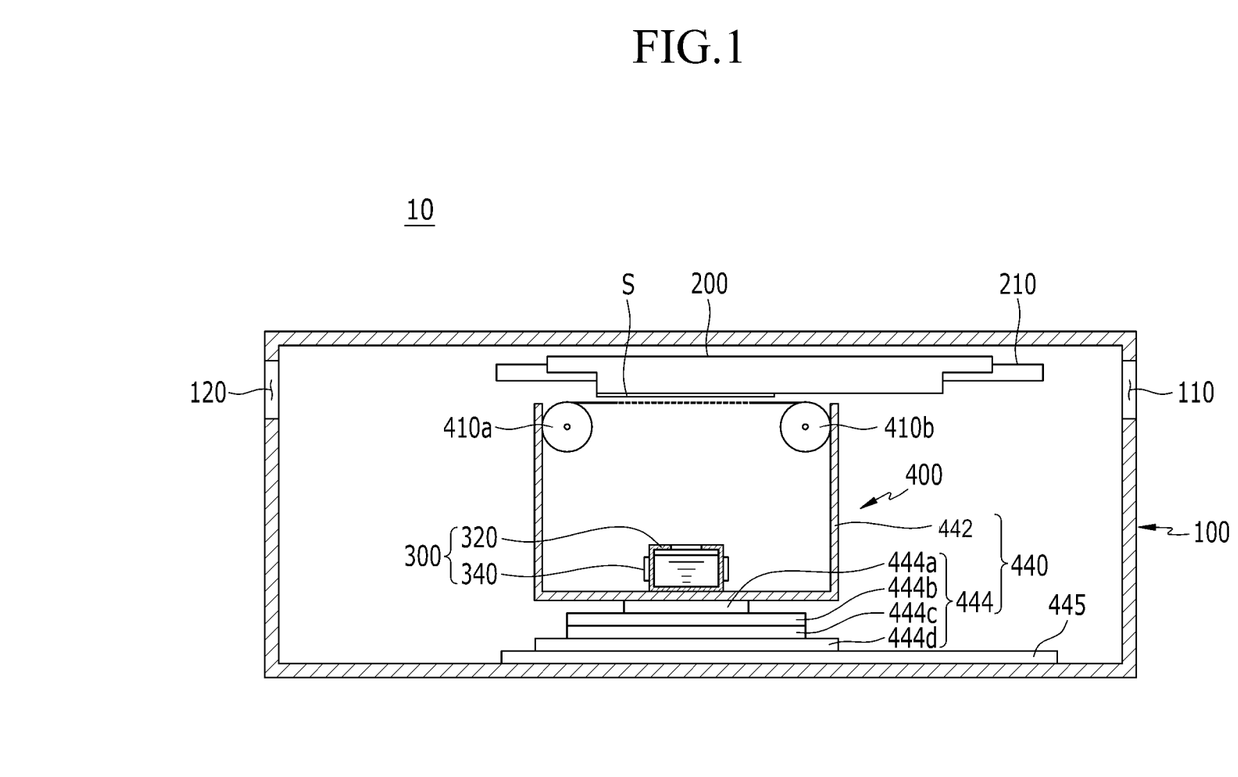
FIG. 1 is a cross-sectional view of an organic thin film deposition apparatus according to an exemplary embodiment.

FIG. 1 is a cross-sectional view of an organic thin film deposition apparatus 10 according to an exemplary embodiment. Referring to FIG. 1, an organic thin film deposition apparatus 10 includes a process chamber 100, a substrate supporting member 200, a deposition source or deposition material supplier 300, and a deposition mask assembly 400.

The process chamber 100 provides a space in which a deposition process is performed. For example, the deposition process may be a process of depositing an organic emission layer by supplying an organic material to a lower surface, which is a deposition surface of the substrate S.

Openings 110 and 120 are respectively formed at side walls of the process chamber 100, and the openings 110 and 120 may be opened/closed by a gate valve (not shown). The substrate S is loaded to the process chamber 100 through one opening 110 and is unloaded from the process chamber 100 through the other opening 120. The process chamber 100 may be connected to a vacuum pump (not shown) to maintain a vacuum state inside the process chamber 100 when performing the process.

The substrate supporting member or substrate support 200 is disposed at an upper part inside the process chamber 100 and supports the substrate S that is loaded to the process chamber 100 through the opening 110. The substrate supporting member 200 may support the substrate S for the deposition surface to face down. Also, the substrate supporting member 200 may be moved in a horizontal direction along a moving guide 210 in the process chamber 100.

The deposition source 300 may be disposed at a lower part inside the process chamber 100 to face the substrate supporting member 200, and an organic material is supplied to the deposition surface of the substrate S supported by the substrate supporting member 200. The organic material supplied by the deposition source 300 is deposited at the deposition surface of the substrate S through a deposition pattern of a thin film mask 420 that is described later.

The deposition source 300 includes a container 320 and a heating member 340. The container 320 receives the organic material that is deposited to the substrate S, and the heating member 340 heats the container 320 to generate a fume from the organic material thereby providing heat to the organic material.

The deposition mask assembly 400 may be provided as a roll-to-roll type. The deposition mask assembly 400 may include first and second rollers 410a and 410b, the thin film mask 420 as a roll, and a moving unit 440.

The first and second rollers 410a and 410b may be disposed under the substrate S supported by the substrate supporting member 200 and spaced from each other. In embodiments, the rollers are arranged in a direction parallel to the moving direction of the substrate S. One of the first and second rollers 410a and 410b may function as a supply reel, and the other may function as a taking up reel.

The thin film mask 420 may be, for example, a mask used in the deposition process of the electrodes (anode/cathode) of the organic light emitting diode (OLED) display and the organic light emitting layer. The thin film mask 420 may be provided with a thin film shape of a flexible material. For example, the thin film mask 420 may be provided as a thin film of a polymer material such as polyethylene terephthalate (PET), polyimide (PI), a thin film of a metallic material such as a metal foil, or a thin film of a glass material.

If the thin film mask 420 is provided as the thin film shape of the flexible material, a precise fine pattern may be formed in the thin film mask 420, and thereby a high resolution pixel may be deposited at the substrate S.

The thin film mask 420 may be extended with a belt shape, and the thin film mask 420 may include a plurality of deposition patterns P having different shapes arranged along a length direction thereof. The thin film mask 420 is wound to the first and second rollers 410a and 410b, and one among a plurality of deposition patterns P may be positioned to face the substrate S by the rotation of the first and second rollers 410a and 410b.

Also, tension of the thin film mask 420 may be controlled by the rotation of the first and second rollers 410a and 410b. By the tension control of the thin film mask 420, sagging of the thin film mask 420 is minimized or avoided such that the thin film mask 420 may be positioned to be close to the substrate S, thereby depositing the high resolution pixel to the substrate S.

The moving unit 440 includes a roller supporting member 442 and a driver 444 to move the first and second rollers 410a and 410b such that the thin film mask 420 may be relatively moved with respect to the deposition surface of the substrate S.

The roller supporting member 442 may have a box shape and an opened top. Adjacent the one opened top, the roller supporting member 442 is coupled to the first and second rollers 410a and 410b to support the first and second rollers 410a and 410b, and the deposition source 300 may be received inside the roller supporting member 442.

The driver 444 may include a rotation driver 444a and first to third linear drivers 444b, 444c, and 444d. The rotation driver 444a rotates the roller supporting member 442 about a rotation axis perpendicular to the deposition surface of the substrate S. The first linear driver 444b linearly moves the roller supporting member 442 and the rotation driver 444a in the rotation axis direction, that is, the height direction. The second linear driver 444c linearly moves the roller supporting member 442, the rotation driver 444a, and the first linear driver 444b in a first direction parallel to the deposition surface of the substrate S, that is, a direction perpendicular to the moving direction of the substrate S. The third linear driver 444d linearly moves the roller supporting member 442, the rotation driver 444a, and the first and second linear drivers 444b and 444c in a second direction perpendicular to the first direction, that is, the moving direction of the substrate S. The third linear driver 444d may be installed on a base 445 that is extended in the moving direction of the substrate S.

The thin film mask 420 may be aligned to the deposition surface of the substrate S by the rotation and linear movement of the roller supporting member 442 by the rotation driver 444a and the first to third linear drivers 444b, 444c, and 444d. Also, in embodiments, when depositing a large area substrate having a large area, two or more regions of the substrate are sequentially deposited. The substrate supporting member 200 and the thin film mask 420 may be relatively moved by using the third linear driver 444d to place one of regions above the mask 420.

Hereinafter, a method of depositing the organic material to the substrate S by using the organic thin film deposition apparatus 10 having the described elements will be described.

Figure 2A:
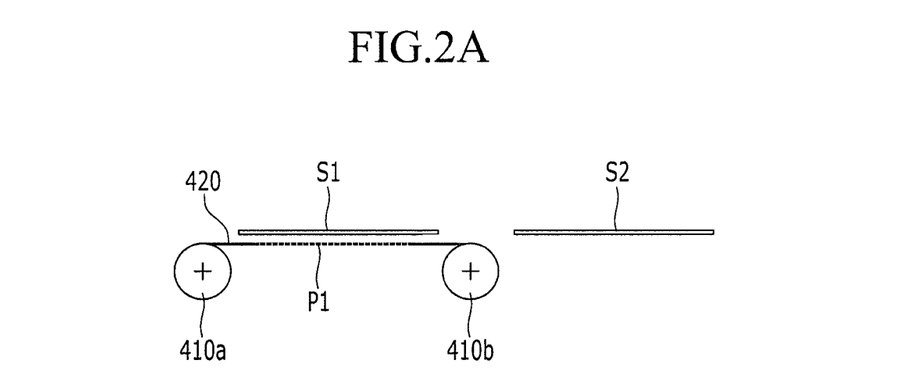
FIG. 2A to FIG. 2C are views showing a process of processing a small area substrate by using the organic thin film deposition apparatus of FIG. 1.
Figure 2B:
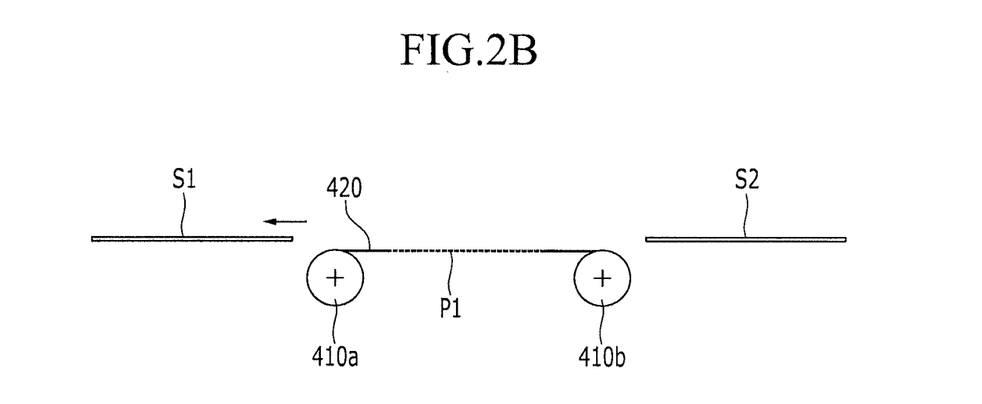
Figure 2C:
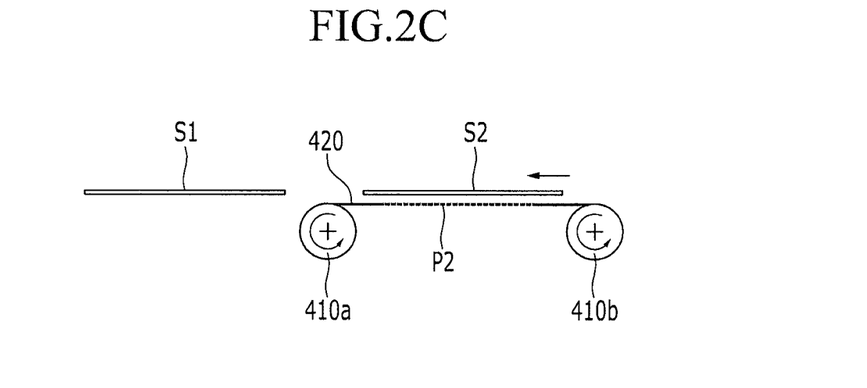

FIG. 2A to FIG. 2C are views showing a process processing a small area substrate by using the organic thin film deposition apparatus of FIG. 1.

Referring to FIG. 1 and FIG. 2A to FIG. 2C, the first substrate S1 is loaded to the process chamber 100 through the opening 110. The first substrate S1 is a substrate in which the deposition layer is formed with a first deposition pattern P1 among the deposition patterns of the thin film mask 420.

The first substrate S1 loaded to the process chamber 100 is supported by the substrate supporting member 200 and is moved to the process position on the thin film mask 420 by the movement of the substrate supporting member 200 along the moving guide 210.

The first and second rollers 410a and 410b of the deposition mask assembly 400 move the thin film mask 420 such that the first deposition pattern P1 among the deposition patterns is positioned at the process position, that is, the position facing the first substrate S1.

The deposition source 300 heats the organic material to generate a fume, and the generated fume of the organic material is deposited to the deposition surface of the first substrate S1 through the first deposition pattern P1 of the thin film mask 420.

If the deposition process for the first substrate S1 is completed, the substrate supporting member 200 moves in the direction toward the opening 120 along the moving guide 210, and the first substrate S1 is unloaded from the process chamber 100 through the opening 120.

Next, the second substrate S2 is loaded to the process chamber 100 through the opening 110. The second substrate S2 is a substrate in which the deposition layer is formed with a second deposition pattern P2 among the deposition patterns of the thin film mask 420.

The second substrate S2 loaded to the process chamber 100 is supported by the substrate supporting member 200 and is moved to the process position on the thin film mask 420 by the movement of the substrate supporting member 200 along the moving guide 210.

The first and second rollers 410a and 410b of the deposition mask assembly 400 move the thin film mask 420 such that the second deposition pattern P2 among the deposition patterns is positioned at the process position, that is, the position facing the second substrate S2.

The fume of the organic material generated by the deposition source 300 is deposited to the deposition surface of the second substrate S2 through the second deposition pattern P2 of the thin film mask 420.

As described above, the organic thin film deposition apparatus 10 according to an exemplary embodiment performs the deposition process of the different patterns P1 and P2 of the thin film mask 420 for the substrates S1 and S2 in which the deposition layers of the different shapes are deposited.

Figure 3A:
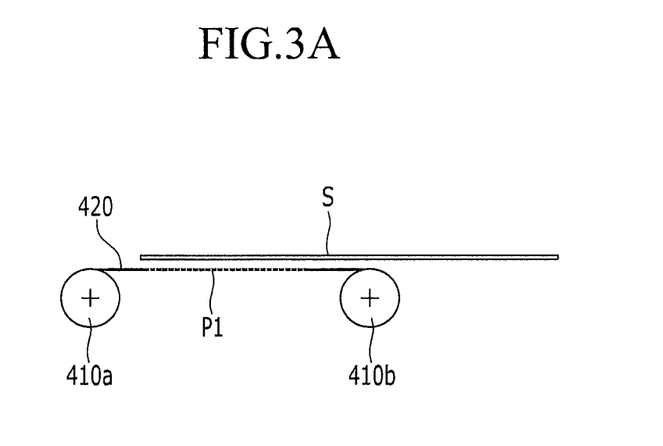
FIG. 3A and FIG. 3B are views showing one example of a process of processing a large area substrate by using the organic thin film deposition apparatus of FIG. 1.
Figure 3B:
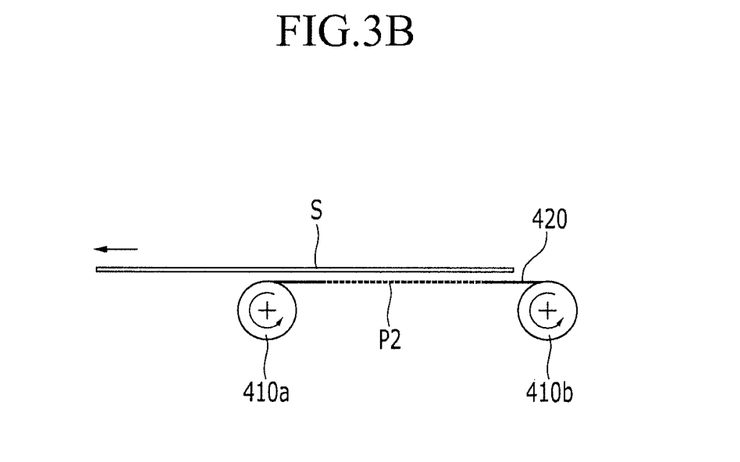

FIG. 3A and FIG. 3B are views showing one example of a process of processing a large area substrate by using the organic thin film deposition apparatus of FIG. 1.

Referring to FIG. 1, FIG. 3A, and FIG. 3B, the large area substrate S is loaded to the process chamber 100 through the opening 110. In embodiments, the large area substrate S is a substrate which needs sequential deposition for two or more predetermined regions by using two or more deposition patterns among the deposition patterns of the thin film mask 420.

The large area substrate S loaded to the process chamber 100 is supported by the substrate supporting member 200 and is moved to the process position on the thin film mask 420 by the movement of the substrate supporting member 200 along the moving guide 210.

The first and second rollers 410a and 410b of the deposition mask assembly 400 move the thin film mask 420 such that the first deposition pattern P1 among the deposition patterns is positioned at the process position such that the first deposition pattern is placed between the deposition source and a first region of the large area substrate.

The deposition source 300 generates the fume of the organic material, and the fume is deposited at the first region of the large area substrate S through the first deposition pattern P1 of the thin film mask 420.

When the deposition process for the first region of the large area substrate S is completed, the second region of the large area substrate S is moved to the process position by the movement of the substrate supporting member 200 along the moving guide 210.

The first and second rollers 410a and 410b of the deposition mask assembly 400 move the thin film mask 420 such that the second deposition pattern P2 of the deposition patterns is positioned at the process position such that the second deposition pattern is placed between the deposition source and the second region of the large area substrate S.

The fume of the organic material generated by the deposition source 300 is deposited to the second region of the large area substrate S through the second deposition pattern P2 of the thin film mask 420.

As described above, the organic thin film deposition apparatus 10 according to an exemplary embodiment may perform the deposition process of the different patterns P1 and P2 of the thin film mask 420 for the predetermined regions of the large area substrate S while moving the large area substrate S in the stage where the positions of the first and second rollers 410a and 410b are fixed.

Figure 4A:
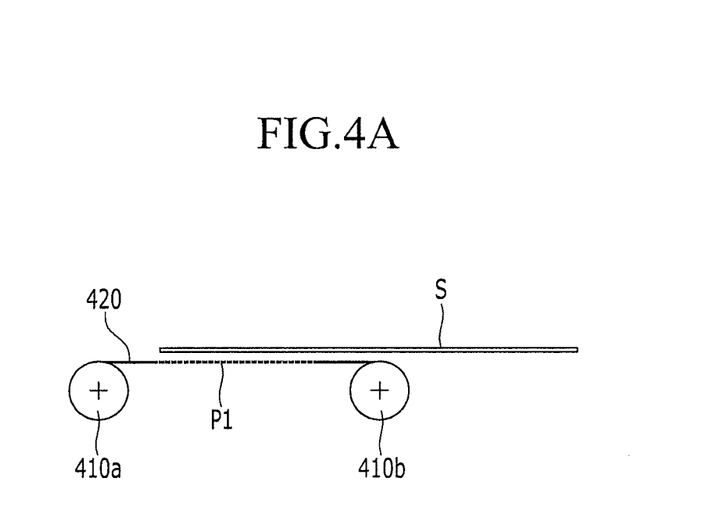
FIG. 4A and FIG. 4B are views showing another example of a process of processing a large area substrate by using the organic thin film deposition apparatus of FIG. 1.
Figure 4B:
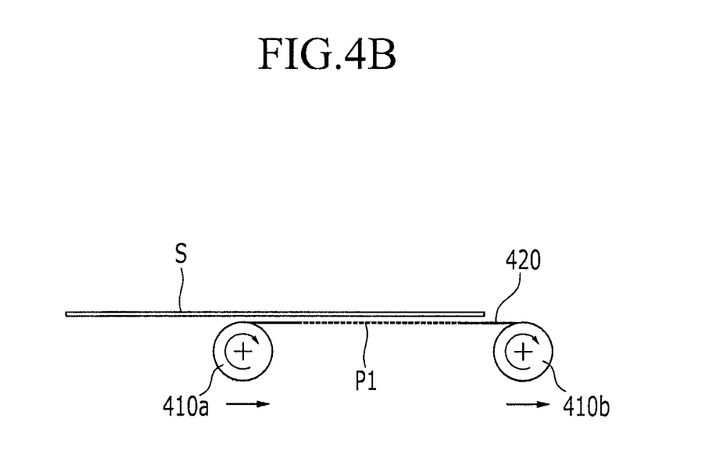

FIG. 4A and FIG. 4B are views showing another example of a process of processing a large area substrate by using the organic thin film deposition apparatus of FIG. 1.

Referring to FIG. 1, FIG. 4A, and FIG. 4B, the large area substrate S is loaded to the process chamber 100 through the opening 110. In embodiments, the large area substrate S is a substrate which needs sequential deposition for two or more predetermined regions by using two or more deposition patterns among the deposition patterns of the thin film mask 420.

The large area substrate S loaded to the process chamber 100 is supported by the substrate supporting member 200 and is moved to the process position on the thin film mask 420 by the movement of the substrate supporting member 200 along the moving guide 210.

The first and second rollers 410a and 410b of the deposition mask assembly 400 move the thin film mask 420 such that the first deposition pattern P1 among the deposition patterns is positioned at the process position such that the first deposition pattern is placed between the deposition source and a first region of the large area substrate.

The deposition source 300 generates the fume of the organic material, and the fume is deposited at the first region of the large area substrate S through the first deposition pattern P1 of the thin film mask 420.

When the deposition process is completed for the first region of the large area substrate S, in the state that the position of the large area substrate S is fixed, the third linear driver 444d moves the roller supporting member 442 in the moving direction of the substrate S such that the first and second rollers 410a and 410b are moved to the process position corresponding to the second region of the large area substrate S. At this time, the deposition source 300 positioned inside the roller supporting member 442 is moved to the process position corresponding to the second region of the large area substrate S by the movement of the roller supporting member 442.

Next, the first and second rollers 410a and 410b move the thin film mask 420 such that the second deposition pattern P2 among the deposition patterns is positioned at the process position such that the second deposition pattern is placed between the deposition source and the second region of the large area substrate S.

The deposition source 300 generates the fume of the organic material, and the fume is deposited at the second region of the large area substrate S through the second deposition pattern P2 of the thin film mask 420.

As described above, the organic thin film deposition apparatus 10 according to an exemplary embodiment may perform the deposition process of the different patterns P1 and P2 of the thin film mask 420 for the predetermined regions of the large area substrate S while moving the first and second rollers 410a and 410b to the position corresponding to the predetermined region of the large area substrate S in the state that the position of the large area substrate S is fixed.

Figure 5:
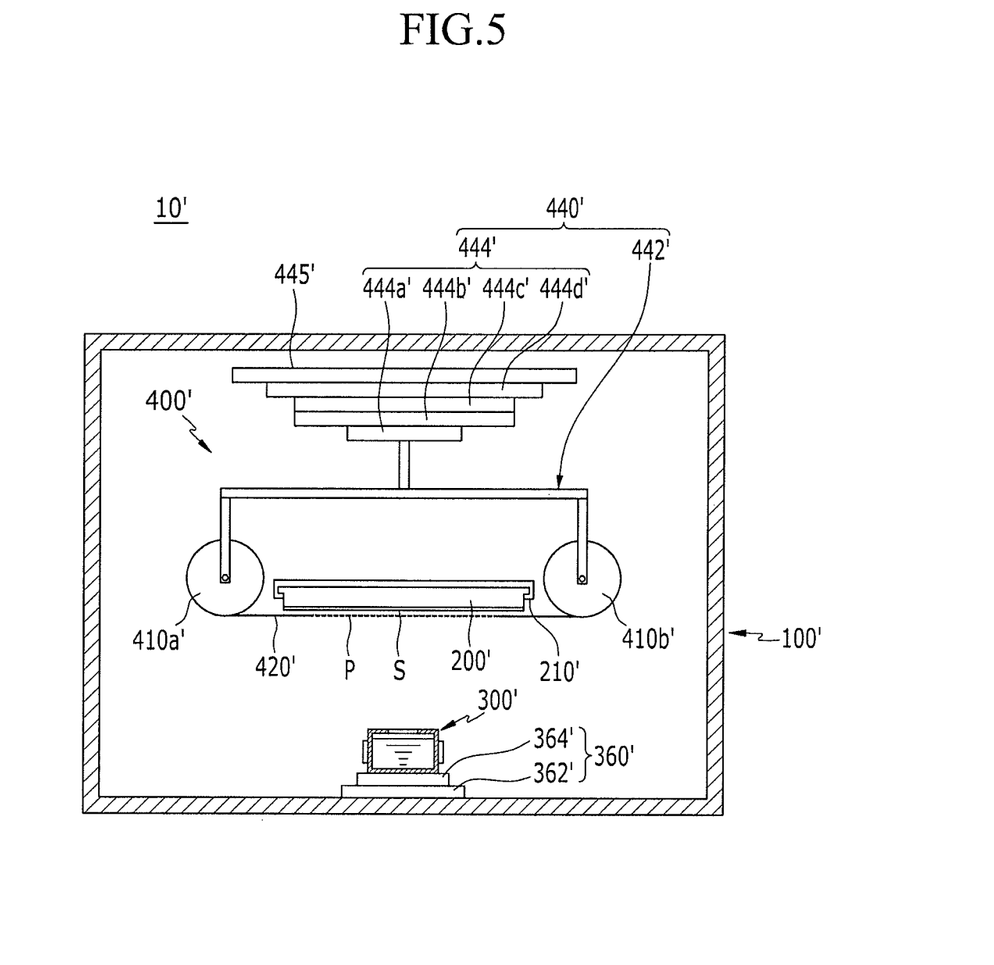
FIG. 5 is a cross-sectional view of an organic thin film deposition apparatus according to an exemplary embodiment.
Figure 6:
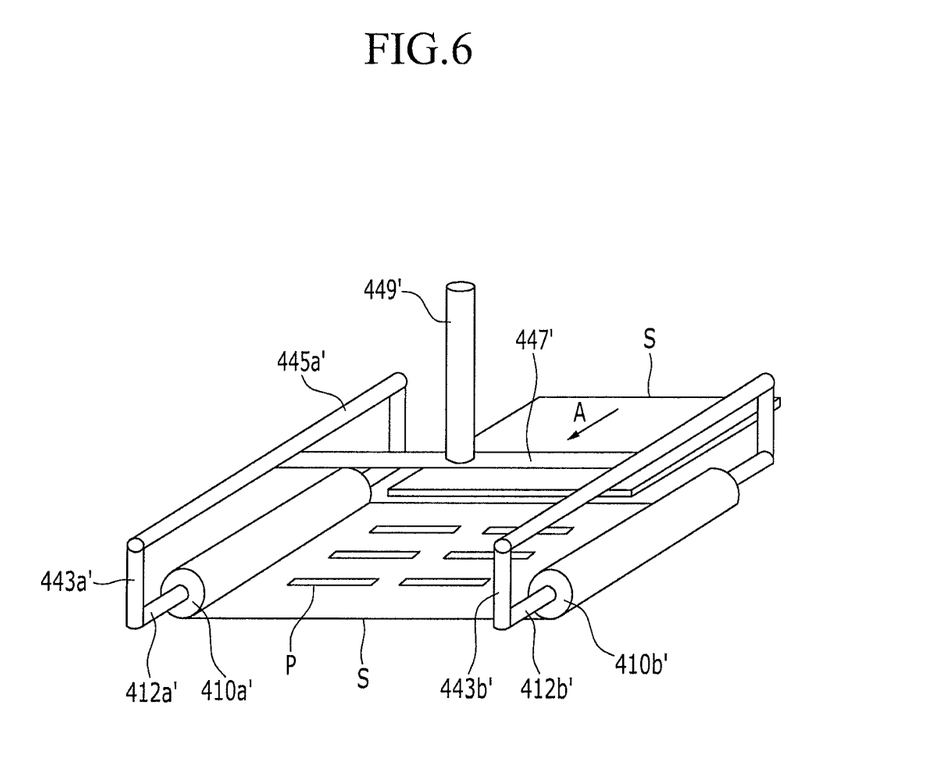
FIG. 6 is a perspective view of the deposition mask assembly of FIG. 5.

FIG. 5 is a cross-sectional view of an organic thin film deposition apparatus according to an exemplary embodiment, and FIG. 6 is a perspective view of the deposition mask assembly of FIG. 5.

Referring to FIG. 5 and FIG. 6, the organic thin film deposition apparatus 10' includes a process chamber 100', a substrate supporting member 200', a deposition source 300', and a deposition mask assembly 400'.

The substrate supporting member 200' is disposed inside the process chamber 100', and the substrate supporting member 200' supports the substrate S loaded to the process chamber 100'. The substrate supporting member 200' may support the substrate S for the deposition surface to face down. Also, the substrate supporting member 200' may be moved in a horizontal direction along a moving guide 210' in the process chamber 100'. The moving direction of the substrate supporting member 200' by the moving guide 210' is an arrow direction A shown in FIG. 6 or an opposite direction thereto.

The deposition source 300' may be disposed at a lower part inside the process chamber 100' to face the substrate supporting member 200', and an organic material is supplied to the deposition surface of the substrate S supported by the substrate supporting member 200'.

The deposition source 300' may be linearly moved parallel to the substrate S in the arrow direction A or the opposite direction thereto by a driver 360'. The driving unit 360' may include a guide member 362' and a driver 364'. The guide member 362' is elongated in the arrow direction A, and for example, may be a linear motor (LM) guide. The driver 364' may be a linear motor. The driver 364' is coupled to the guide member 362' to be linearly moved along the guide member 362', and the deposition source 300' is coupled to the driver 364'. That is, the deposition source 300' may be linearly moved along the length direction of the guide member 362'.

The deposition mask assembly 400' may be provided as a roll-to-roll type. The deposition mask assembly 400' may include first and second rollers 410a' and 410b', a thin film mask 420', and a moving unit 440'.

The first and second rollers 410'a and 410'b may be aligned for the length direction to be toward the arrow direction A, and may be disposed to be separated to both sides of the substrate supporting member 200'.

The thin film mask 420' may be, for example, a mask used in the deposition process of the electrodes (anode/cathode) of the organic light emitting diode (OLED) display and the organic light emitting layer. The thin film mask 420' may be provided with a thin film shape of a flexible material. For example, the thin film mask 420' may be provided as a thin film of a polymer material such as polyethylene terephthalate (PET), polyimide (PI), a thin film of a metallic material such as a fetal foil, or a thin film of a glass material.

The thin film mask 420' may be extended with a belt shape, and the thin film mask 420' may include a plurality of deposition patterns P having different shapes and being arranged along a length direction thereof. The thin film mask 420' is rolled to the first and second rollers 410a' and 410b', and one among a plurality of deposition patterns P may be positioned to face the substrate S by the rotation of the first and second rollers 410a' and 410b'. Also, the tension of the thin film mask 420' may be controlled by the rotation of the first and second rollers 410a' and 410b'.

The moving unit 440' includes a roller supporting member 442' and a driver 444' to move the first and second rollers 410a' and 410b' such that the thin film mask 420' may be relatively moved with respect to the deposition surface of the substrate S.

The roller supporting member 442' is positioned at the opposite side of the deposition source 300' with respect to the thin film mask 420' and supports the first and second rollers 410a' and 410b'.

For example, the roller supporting member 442' may include first and second vertical loads 443a' and 443b', first and second horizontal loads 445*a*' and 445*b*', a connection load 447', and a main load 449'.

The lower end of the first vertical loads 443*a*' is coupled to both ends of a rotation axis 412*a*' of the first roller 410*a*', and the lower end of the second vertical loads 443*b*' is coupled to both ends of a rotation axis 412*b*' of the second roller 410*b*'. The first horizontal load 445*a*' is connected to the upper end of the first vertical loads 443*a*', and the second horizontal load 445*b*' is connected to the upper end of the second vertical loads 443*b*'. The connection load 447' is connected to the center portion of the first horizontal load 445*a*' and the center portion of the second horizontal load 445*b*', and the main load 449' is coupled perpendicularly to the center of the connection load 447'.

The driver 444' may include a rotation driver 444*a*' and first to third linear drivers 444*b*', 444*c*', and 444*d*'. The rotation driver 444*a*' rotates the roller supporting member 442' about a rotation axis perpendicular to the deposition surface of the substrate S. The first linear driver 444*b*' linearly moves the roller supporting member 442' and the rotation driver 444*a*' in the rotation axis direction, that is, the height direction. The second linear driver 444*c*' linearly moves the roller supporting member 442', the rotation driver 444*a*', and the first linear driver 444*b*' in a first direction parallel to the deposition surface of the substrate S, that is, a direction perpendicular to the moving direction of the substrate S. The third linear driver 444*d*' linearly moves the roller supporting member 442', the rotation driver 444*a*', and the first and second linear drivers 444*b*' and 444*c*' in a second direction perpendicular to the first direction, that is, the moving direction of the substrate S. The third linear driver 444*d*' may be installed on the base 445' that is extended in the arrow direction A.

The thin film mask 420' may be aligned to the deposition surface of the substrate S by the rotation and linear movement of the roller supporting member 442' by the rotation driver 444*a*' and the first to third linear drivers 444*b*', 444*c*', and 444*d*'. Also, when loading the large area substrate to the substrate supporting member 200', the thin film mask 420' may be positioned under a different region of the large area substrate by the linear movement of the roller supporting member 442' by the third linear driver 444*d*'.

Meanwhile, the processing processes of the small area substrate and the large area substrate shown in FIG. 2 to FIG. 4 may also be performed by the organic thin film deposition apparatus 10' according to an exemplary embodiment.

Although the exemplary embodiments have been described, those skilled in the art will readily appreciate that many modifications are possible without materially departing from the novel teachings and advantages. Therefore, the foregoing disclosure of the exemplary embodiments is to provide explanation and do not limit the present invention. The scope of the present invention should be construed by the claims below, and all equivalents should fall within the scope of the present invention.

What is claimed is:

1. A thin film deposition apparatus comprising:
    a process chamber;
    a substrate support comprising a substantially flat surface configured to support a substrate in the process chamber;
    a deposition source configured to supply an organic material for deposition onto the substrate;
    a deposition mask assembly comprising first and second rollers disposed apart from each other in the process chamber;
    a thin film mask roll having a first end wound about the first roller and a second end wound about the second roller, wherein a deposition mask is defined on a first plane with a portion of the thin film mask roll extending between the first and second rollers, wherein the thin film mask roll further comprises one or more additional deposition masks, the deposition masks comprising deposition patterns substantially different from each other and being arranged in a length direction of the thin film mask roll;
    a substrate transporting mechanism configured to transfer the substrate support on a second plane substantially parallel to the first plane within the process chamber, wherein the deposition mask is disposed between the deposition source and the substrate support; and
    a moving unit configured to move the first and second rollers with respect to the substrate support,
    wherein the moving unit comprises:
        a roller support member positioned at an opposite side of the deposition source with respect to the deposition mask and coupled with the first and second rollers; and
        a driver configured to move the roller support member,
    wherein the driver comprises:
        a rotation driver configured to rotate the roller support member about a rotation axis perpendicular to the first plane;
        a first linear driver configured to linearly move the roller support member in a direction of the rotation axis;
        a second linear driver configured to linearly move the roller support member in a first direction parallel to the first plane; and
        a third linear driver linearly moving the roller support member in a second direction perpendicular to the first direction and parallel to the first plane.

2. The thin film deposition apparatus of claim 1 wherein the thin film mask roll comprises one selected from the group consisting of a polymer, a metal, or a glass material.

3. The thin film deposition apparatus of claim 1, wherein the substrate support is configured to load a substrate subject to deposition using one deposition pattern selected among the deposition patterns; and
    wherein the first and second rollers are configured to rotate such that the selected deposition pattern of the thin film mask roll is placed between the first and second rollers.

4. The thin film deposition apparatus of claim 1, wherein the substrate support is configured to load a substrate subject to deposition using at least two deposition patterns selected among the deposition patterns; and
    wherein the first and second rollers are configured to rotate along with movement of the substrate support, the first and second rollers, and the deposition source such that the selected deposition patterns of the thin film mask roll are sequentially provided between the first and second rollers to deposit different regions on the substrate.

5. The thin film deposition apparatus of claim 4, wherein the substrate support is configured to move in a direction parallel to the deposition mask with respect to the first and second rollers.

6. The thin film deposition apparatus of claim 4, wherein the first and second rollers and the deposition source are configured to move in a direction parallel to the substrate with respect to the substrate support.

* * * * *